United States Patent
Confalonieri et al.

(10) Patent No.: US 6,600,437 B1
(45) Date of Patent: Jul. 29, 2003

(54) HIGH RESOLUTION, HIGH SPEED, LOW POWER SWITCHED CAPACITOR DIGITAL TO ANALOG CONVERTER

(75) Inventors: Pierangelo Confalonieri, Caponago (IT); Marco Zamprogno, Cesano Maderno (IT); Angelo Nagari, Cilavegna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/115,272

(22) Filed: Apr. 1, 2002

(51) Int. Cl.$^7$ ............... H03M 1/66; H03B 1/00; H03K 5/00; H04B 1/10
(52) U.S. Cl. ............... 341/150; 327/554
(58) Field of Search ............... 341/144, 145, 341/150, 172, 120, 143; 327/553, 93, 554; 331/111, 44

(56) References Cited

U.S. PATENT DOCUMENTS

| | | | |
|---|---|---|---|
| 4,568,917 A | | 2/1986 | McKenzie et al. |
| 4,857,930 A | * | 8/1989 | Lucas .................. 341/150 |
| 5,767,801 A | * | 6/1998 | Okamoto ............... 341/145 |
| 6,081,218 A | * | 6/2000 | Ju et al. ............... 341/150 |
| 6,154,162 A | * | 11/2000 | Watson et al. .......... 341/150 |
| 6,271,784 B1 | * | 8/2001 | Lynn et al. ............ 341/150 |
| 6,486,812 B1 | * | 11/2002 | Tanaka ................. 341/144 |
| 6,515,612 B1 | * | 2/2003 | Abel ................... 341/172 |

* cited by examiner

*Primary Examiner*—Patrick Wamsley
(74) *Attorney, Agent, or Firm*—Lisa K. Jorgenson; Dennis M. de Guzman; Seed IP Law Group PLLC

(57) ABSTRACT

A switched capacitor digital to analog converter includes first and second converter segments having respective first and second arrays of binary weighted capacitors. Each capacitor of the first segment has a first electrode connected to a first common node and a second electrode connected through respective switches to one of first and second reference voltage terminals. Each capacitor of the second segment has a first electrode connected to a second common node and a second electrode connected through respective switches to one of the first and second reference voltage terminals. The converter includes a coupling capacitor connected between the first and second common nodes and capacitance means connected between the first common node and a reference voltage terminal. The coupling capacitor and capacitance means have capacitances, $C_s$ and $C_{ATT}$ respectively, that substantially satisfy the relationship: $(2^p-1) \cdot C_s - C_{ATT} = 2^p \cdot C$, where p is the number of bits coded in the first converter segment and C is the unit capacitance.

17 Claims, 7 Drawing Sheets

HIGH RESOLUTION, HIGH SPEED, LOW POWER SWITCHED CAPACITOR DIGITAL TO ANALOG CONVERTER

BACKGROUND OF THE INVENTION

1. Field of the Invention

The present invention relates to switched capacitor converters and, more particularly, to a high resolution, high speed, low power switched capacitor digital to analog converter (DAC).

2. Description of the Related Art

A switched capacitor analog to digital converter (ADC) operated according to the known SAR (Successive Approximation Register) technique comprises a plurality of weighted capacitors with associated switches and a local DAC. The capacitors are charged by a voltage sample of an analog signal to be converted. The voltage sample is compared with an analog signal generated by the local DAC. Typically, the same weighted capacitors are used both for the ADC and for the local DAC. If the comparison does not result in a coincidence, the local analog signal is changed to reduce the difference between the compared quantities. The comparison is repeated until the local analog signal is equal, within the limits of the converter accuracy, to the sampled analog signal. In this equality condition, the digital value of the local DAC is the digital output of the ADC corresponding to the input voltage sample.

Designing switched capacitor converters having high speed and high resolution in an integrated circuit requires facing problems of silicon area and accuracy. A SAR type switched capacitor converter comprises at least one array of binary weighted capacitors, with each capacitor being associated with a bit of the input code. A 10 bit DAC would require 1024 capacitors having a capacitance distribution according to the power of 2. Since the area of the smallest capacitor cannot be lower than a minimum area determined by the accuracy and linearity conditions set for the converter, each capacitor array would require an unacceptably large amount of silicon area.

To overcome this limitation, it is known to design converters comprising capacitor arrays split into two or more segments, with each segment comprising an array of independently weighted capacitors. In the case of two segments, the first segment is associated with the least significant bits (LSBs) of the digital input code and a second segment is associated with the most significant bits (MSBs) of the digital input code.

Various approaches are known for implementing DACs with segmented weighted capacitor arrays, as shown for example in FIGS. 1, 2 and 3.

FIG. 1 shows a DAC weighted capacitor array having a first segment, indicated as the "upper array", formed of five capacitors with binary coded weights, i.e. with capacitances varying according to a factor $2^i$, where i varies from 0 to 4. The capacitors are indicated by their capacitances C, 2C, 4C, 8C and 16C, where C is preferably a predetermined unit capacitance. An electrode of each of the five capacitors is connected to a common node NSU and another electrode is connected, through a corresponding two-way switch of a group SWU of five switches, to a first or to a second reference voltage terminal VREFP, VREFM. The common node NSU is connected to a circuit 5 which detects and processes the analog signal output from the DAC. The switches SWU are set in one or the other position according to the values of the five most significant bits of a digital 8 bits input code $A_{0-7}$. A second segment, indicated as "lower array" is a resistive voltage divider formed of eight equal resistors $R_0$–$R_7$ connected in series between the terminals VREFP, VREFM of a voltage reference generator (not shown). The seven divider taps and the terminal VREFM can be connected to a common node NSL through an eight-way switch SWL controlled by three bits of the digital input code $A_{0-7}$. The common node NSL is connected to the common node NSU of the upper array through a coupling capacitor $C_s$.

As is known to any person skilled in the art the switches SWU and SWL are preferably implemented as electronic switching arrangements comprising MOS transistors and/or pass-gates.

The DAC of FIG. 1 can be operated at a high speed and at a satisfactory accuracy, but has a high power consumption because the divider is permanently connected to the reference voltage generator. Furthermore, the reference voltage generator must be specifically designed to drive resistive loads and not only capacitive loads and therefore is per se a power consuming component.

Another known two-segment DAC, as shown in FIG. 2, is formed of an upper array identical to the upper array of FIG. 1 and a lower array which is formed as a weighted capacitor array similar to the upper array. In the example shown the lower array comprises three capacitors $CL_0$, $CL_1$, $CL_2$, with binary coded weights having capacitances ranging from capacitance C associated with the least significant bit to 4C of the most significant bit. An electrode of each of the three capacitors is connected to a common node NSL and another electrode is connected selectively, through a corresponding two-way switch of a group SWL of three switches $SWL_0$, $SWL_1$, $SWL_2$, either to the first or to the second reference voltage terminal VREFP, VREFM.

The upper array comprises five capacitors $CU_3$, $CU_4$, $CU_5$, $CU_6$, $CU_7$ with binary coded weights having capacitances ranging from capacitance C associated with the least significant bit of the upper array to 16C of the most significant bit. An electrode of each of the five capacitors is connected to a common node NSU and another electrode is connected selectively, through a corresponding two-way switch of a group SWU of five switches $SWU_3$, $SWU_4$, $SWU_5$, $SWU_6$, $SWU_7$, alternatively to the first second reference voltage terminals VREFP, VREFM.

A correction capacitor $C_c$ having a capacitance equal to the least significant bit capacitance C is connected between node NSL and a reference voltage terminal, in this example ground. The correction capacitor is used, as known, to obtain that the sum of the capacitances in the array is exactly twice the capacitance of the capacitor associated with the most significant bit of the array. The two segments are coupled to one another through a coupling capacitor $C_s$ having a capacitance selected as explained further below. The switches of the upper and lower array are controlled by an eight bit digital input code received from lines $A_{0-7}$.

In the operation the contributions of the switched capacitors $CL_0$, $CL_1$, $CL_2$ to the voltage at the common node NSL are scaled by the series coupling capacitor $C_s$ and transferred to the common node NSU of the upper array.

This approach has the advantage of a low power consumption and does not require a specific voltage reference generator since all the loads are capacitive loads, however it is critical in the design because the conversion linearity is determined by the accuracy of the capacitance of the coupling capacitor $C_s$. It is known that this capacitance must be so selected that the capacitance resulting from the series connection of the coupling capacitor and the capacitance of the parallel connection of the capacitors of the lower array is equal to the capacitance of the smallest capacitor of the upper array. In the example shown $C_s=8/7C=1.142857C$, where C is the unit capacitance, or the capacitance of the smallest capacitor of the array. It is difficult to manufacture the coupling capacitor $C_s$ with the necessary accuracy in many practical cases, in particular when the number of bits to be encoded in the lower array is high. This is a severe limitation for the use of this approach in high resolution converters. In this connection it should be noted that a complex capacitor array in an integrated circuit can be implemented efficiently by the use of a capacitor modular unit, i.e. a capacitor having a predetermined unit capacitance. According to this technique, each capacitor is made up of an integer number of modular units. This approach makes it possible to obtain maximum accuracy and matching. However, the coupling capacitor $C_s$ in general cannot be formed by an integer number of modular units and therefore cannot be designed with the desired accuracy.

A known arrangement for overcoming the limitations of the converter according to FIG. 2 uses an operational amplifier to decouple the lower array from the coupling capacitor $C_s$, as shown in FIG. 3. To obtain a satisfactory conversion linearity it is necessary either that the operational amplifier has a low offset, or that a suitable circuit arrangement is provided to cancel the offset. A disadvantage of this approach is a limitation of the frequency band due to the limited pass-band of the operational amplifier and an increase of the power consumption and noise due to the presence of the operational amplifier.

BRIEF SUMMARY OF THE INVENTION

An embodiment of the present invention provides an improved two-segment switched capacitor digital to analog converter. The embodiment provides a two-segment switched capacitor digital to analog converter formed of capacitors which can be designed with a high accuracy. The two-segment switched capacitor digital to analog converter is operable at a high speed and has a low power consumption.

An embodiment of the invention is a switched capacitor digital to analog converter including:

a first converter segment having a first array of binary weighted capacitors, the capacitances of which are integer multiples of a predetermined unit capacitance, each of said capacitors having a first electrode connected to a first common node and a second electrode connected through respective controllable switching means to either one of a first and second reference voltage terminals;

a second converter segment having a second array of binary weighted capacitors, the capacitances of which are integer multiples of said predetermined unit capacitance, each of the capacitors of the second converter segment having a first electrode connected to a second common node and a second electrode connected through respective controllable switching means to either one of said first and second reference voltage terminals;

a coupling capacitor with a first electrode connected to the first common node and a second electrode connected to the second common node;

control means coupled to the controllable switching means of the first and second converter segments to open or close selectively the connections to the first and second reference voltage terminals depending on the binary values of the bits of the digital input code;

an output terminal connected to the second common node for providing the analog output signal as a function of the digital input code; and capacitance means connected between the first common node and at least one reference voltage terminal;

the coupling capacitor and the capacitance means being so selected that their capacitances, $C_s$ and $C_{ATT}$ respectively, substantially satisfy the following relationship: $(2^p-1) \cdot C_s - C_{ATT} = 2^p \cdot C$, where p is the number of bits coded in the first converter segment and C is the unit capacitance.

The features and the advantages of the present invention will be more clearly understood from the following detailed description taken in conjunction with the accompanying drawings.

DETAILED DESCRIPTION OF THE PREFERRED EMBODIMENTS

Figure 1:
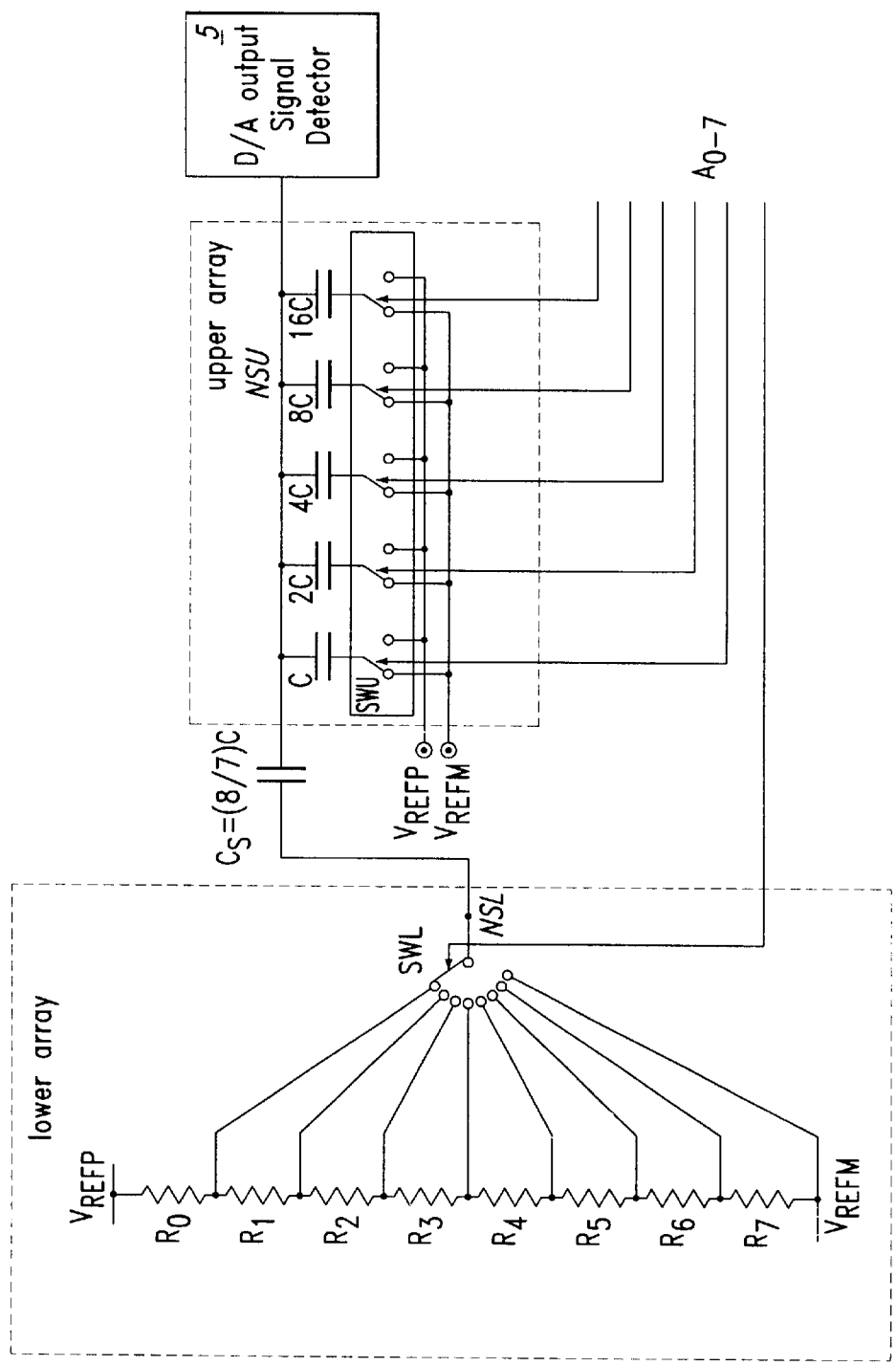
FIGS. 1–3 illustrate schematically three prior art DACs.
Figure 2:
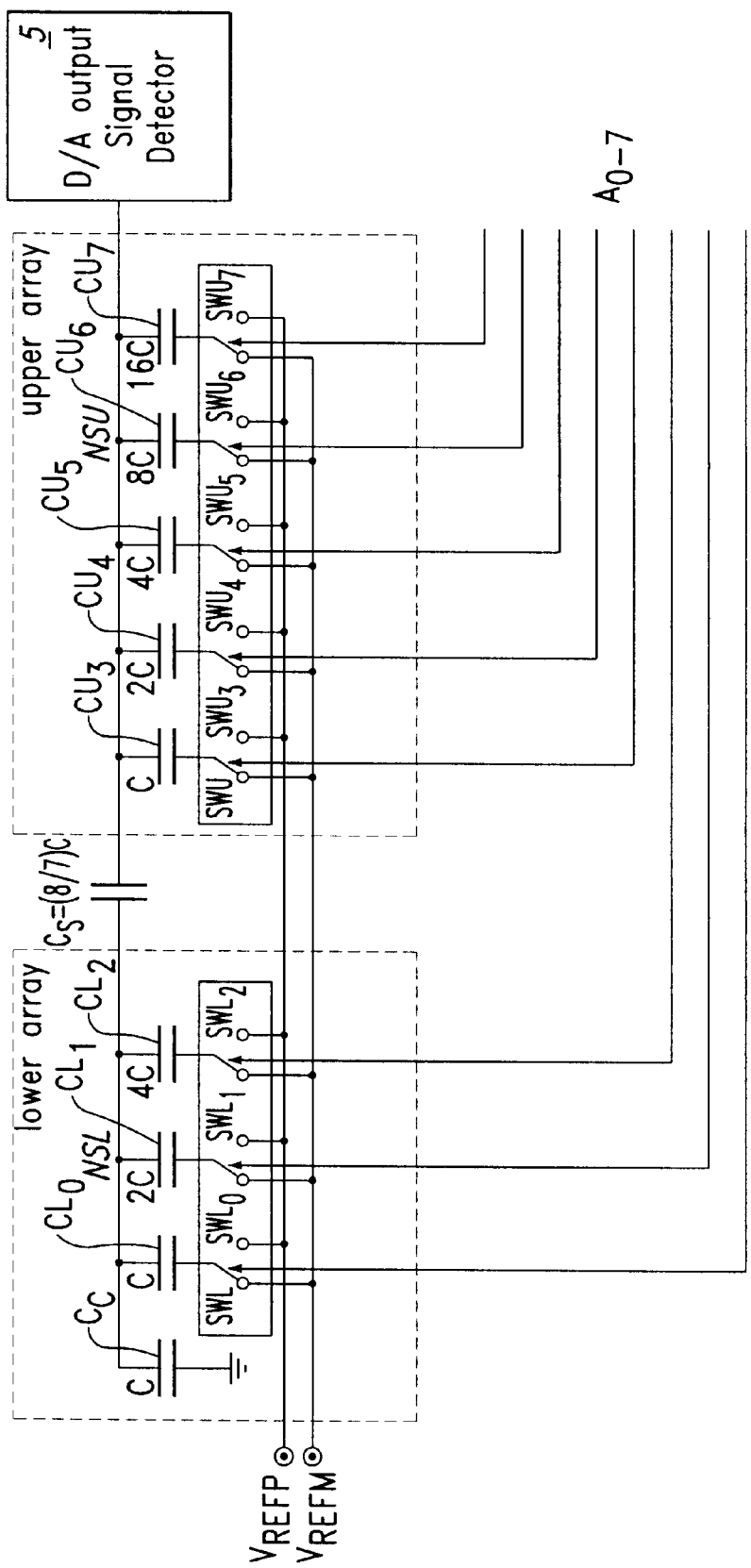
Figure 3:
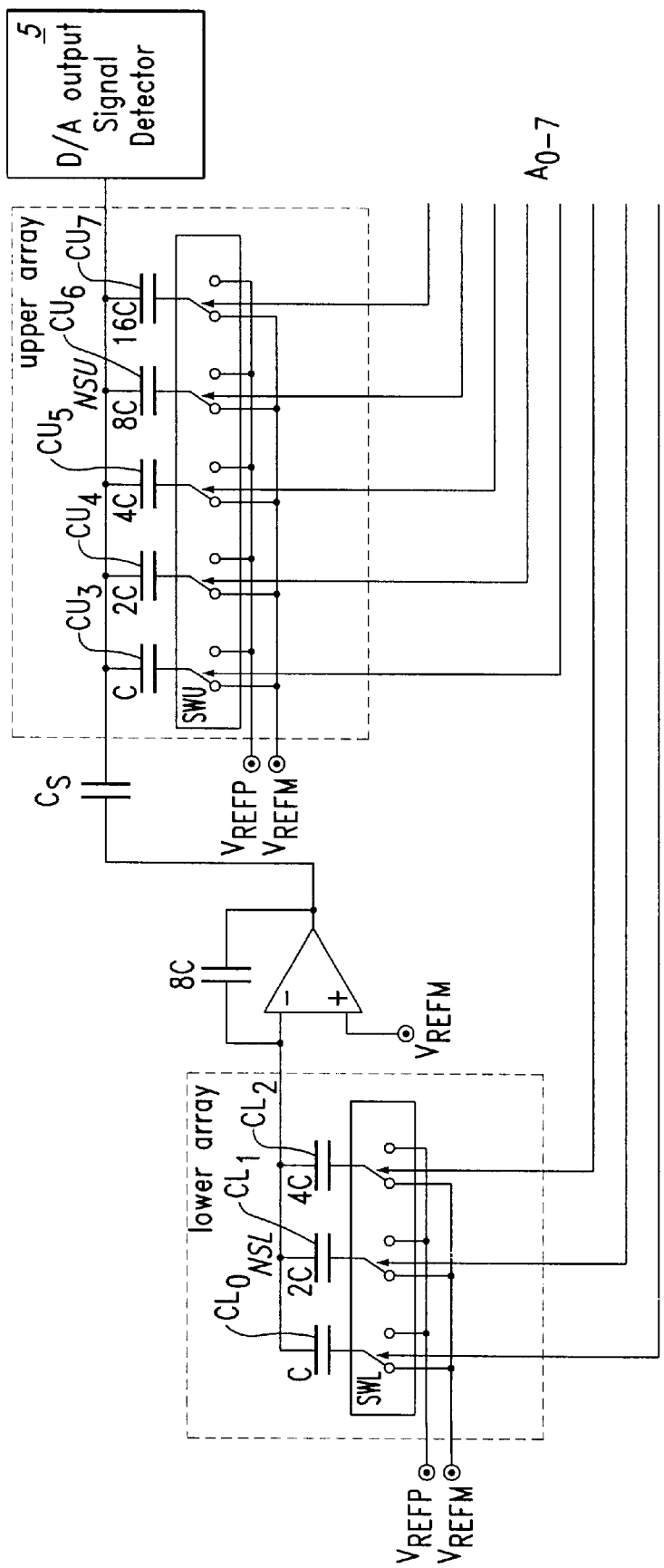
Figure 4:
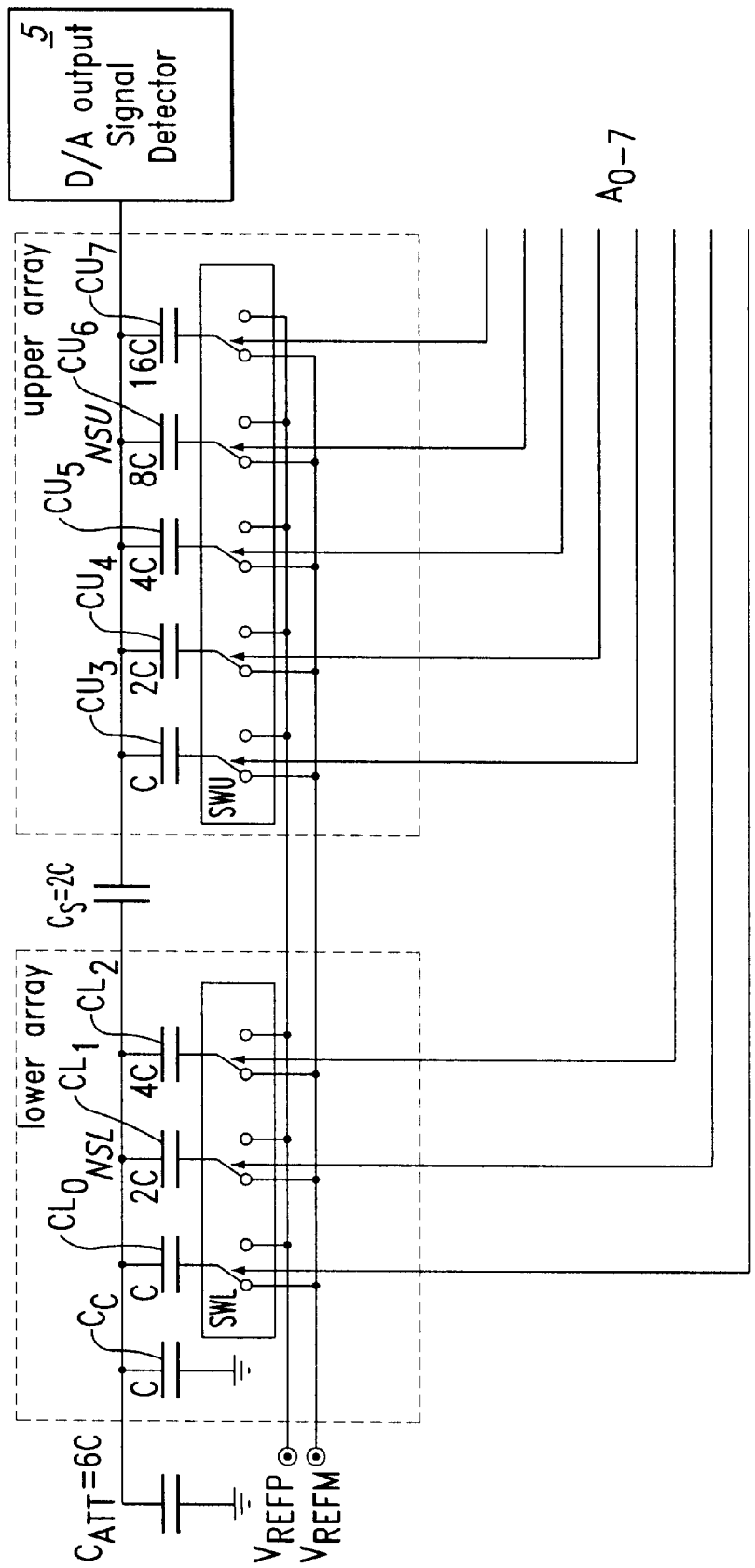
FIG. 4 illustrates schematically a first embodiment of a DAC according to the invention and FIG. 5 illustrates schematically a second embodiment of a DAC according to the invention.

With reference to FIG. 4, where the same reference numerals and symbols as in FIG. 2 are used to indicate the same or equivalent components, a basic circuit arrangement of a single-ended DAC according to the invention is shown. This circuit arrangement differs from the circuit arrangement of FIG. 2 by an additional shunt capacitor, indicated $C_{ATT}$, which is connected between the common node NSL of the lower array and ground. The addition of this capacitor brings about, among other advantages which will be shown below, a substantial advantage in the design of the DAC because it makes possible to design all the capacitors of the DAC, including the coupling capacitor $C_s$, as integer numbers of a unit capacitance.

The inventors have found that a DAC as shown in FIG. 4 is the more linear and accurate in the operation, the more the capacitances $C_s$ and $C_{ATT}$ are close to satisfy the following relationship:

$$(2^p-1) \cdot C_s - C_{ATT} = 2^p \cdot C$$

where C is the unit capacitance and p is the number of the bits coded in the lower array, i.e. the first converter segment. It can be easily shown that, if the capacitance $C_s$ is selected as made up of any integer number of unit capacitance C, the capacitance $C_{ATT}$ is also made up of an integer number of unit capacitance C. For example, if $C_s=2C$, then $C_{ATT}=2C$ if two bits are coded in the lower array, or $C_{ATT}=6C$ if three bits are coded (as in the example of FIG. 4), or $C_{ATT}=14C$ if four bits are coded, and so on.

Therefore, any problems of accuracy and linearity related with the dimensioning of the coupling capacitor $C_s$ is solved simply by the addition of a shunt capacitor $C_{ATT}$ in the lower array. Since all the capacitors of the converter can be designed as integer numbers of a unit capacitance, all the layout tools normally used for obtaining optimum matching of integrated components can be used.

Although the capacitor $C_{ATT}$ is connected to ground in the example as shown in FIG. 4, it should be understood that any fixed voltage reference can be used instead of ground, with no change in the converter operation.

Advantageously, the capacitor with the smallest capacitance in the lower array, i.e. the unit capacitance C, is identical to the capacitor with the smallest capacitance in the upper array.

Figure 5:
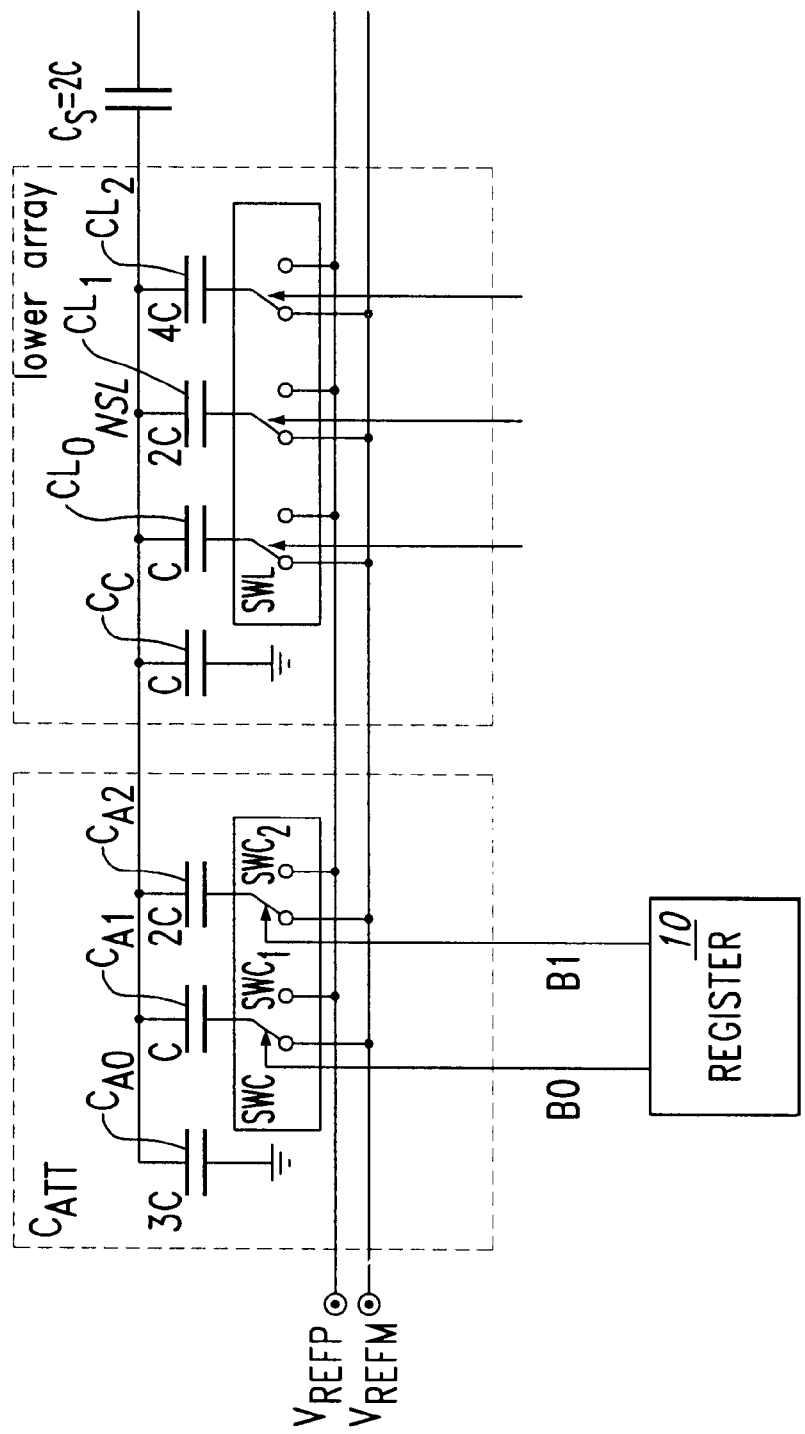

FIG. 5 shows the lower array of a DAC according to an embodiment of the invention which can be used advantageously when it is required that an analog value corresponding to a given correction digital code is added to the analog voltage obtained from the conversion. A typical example of such an application is a DAC or an ADC having an offset to be detected and compensated. In this case, according to the prior art, a dedicated capacitor array is connected to the common node NSU of the upper array to compensate the offset. According to this embodiment of the invention, a dedicated capacitor array is not required. Instead, the shunt capacitance $C_{ATT}$ is arranged as a number of capacitors operatively connected in parallel. In the example shown three capacitors $C_{A0}$, $C_{A1}$, $C_{A2}$ are used to form a capacitance $C_{ATT}=6C$ as in FIG. 4: the first capacitor $C_{A0}$, of capacitance 3C, is connected between the common node NSL and ground and two capacitors $C_{A1}$, $C_{A2}$, of capacitance C and 2C respectively, are connected selectively to the voltage reference terminals VREFP, VREFM through respective two-way switches $SWC_1$, $SWC_2$ of a group SWC of switches. The switches SWC are controlled by a digital code corresponding to the offset to be compensated. In this example the correction digital code consists of two bits B0, B1 stored in a register 10. In the operation, the capacitors C and 2C are charged according to the digital code, thus varying the voltage at the common node NSL by adding a voltage which compensates the offset.

The shunt capacitance $C_{ATT}$ in the lower array provides a further advantage. As is known, a correct operation of the converter requires that the potential at node NSL never exceeds the upper and lower limits of the voltage supply. The additional shunt capacitance $C_{ATT}$ provides a practical tool for designing the lower array to meet this requirement. In fact, the shunt capacitance operates as a voltage attenuator, so that it is easy to limit the dynamics at the node NSL by a proper selection of this capacitance.

As is clear from the above explanations the converter according to the invention can be designed with a high accuracy by using unit capacitances for all the capacitors of the upper and lower arrays and for the coupling capacitor. Furthermore, this design provides a strong improvement of the converter linearity, while the operation speed is as high as the operation speed of the prior art basic design of the capacitor coupled lower and upper array as shown in FIG. 2. The power consumption is also as low as in that prior art design. The additional shunt capacitance in the lower array can be used as a component for further functions, such as an offset compensation. In this case, the increase in the integrated circuit area due to the additional capacitance, which is in any case acceptable in view of the advantages in linearity of the converter and accuracy of operation and design, is more than compensated by a lower overall design complexity.

Figure 6:
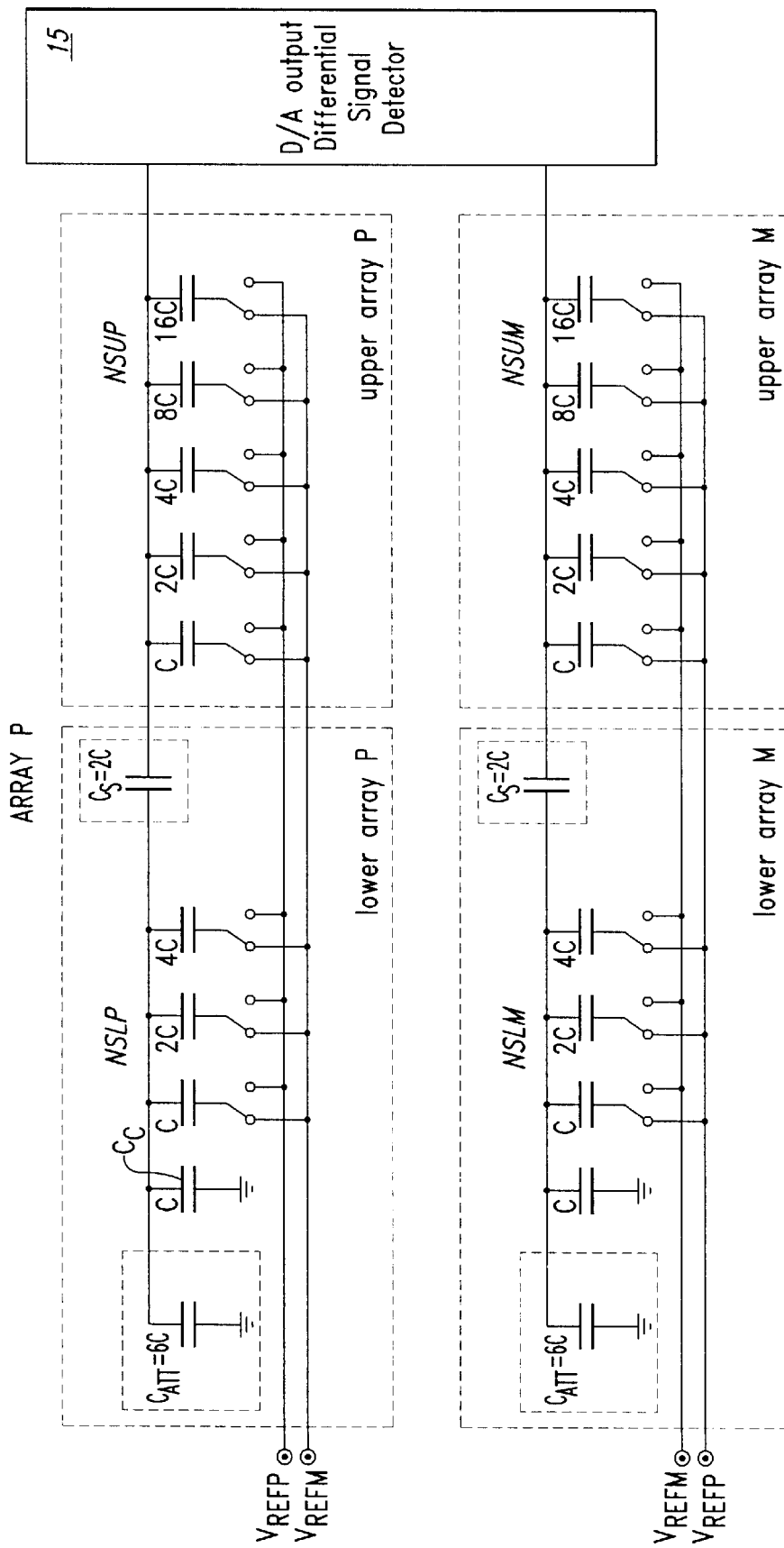
FIG. 6 illustrates schematically a differential DAC according to the invention.

FIG. 6 is a schematic diagram of a differential DAC according to an embodiment of the present invention. The differential DAC includes two identical capacitor arrays: ARRAY P and ARRAPY M. Analogous capacitors in the two arrays are driven in phase opposition: this means that if, for example, the 8C capacitor in the upper array of ARRAY P is connected to VREFP, then the 8C capacitor in the upper array of ARRAY M is connected to VREFM. The operation principle is identical to that of the single ended arrangement. The ARRAY P and ARRAY M have respective output lines NSUP and NSUM that are coupled to differential inputs of a differential signal detector 15 which provides a differential output (i.e., the voltage between nodes NSUP and NSUM).

Figure 7:
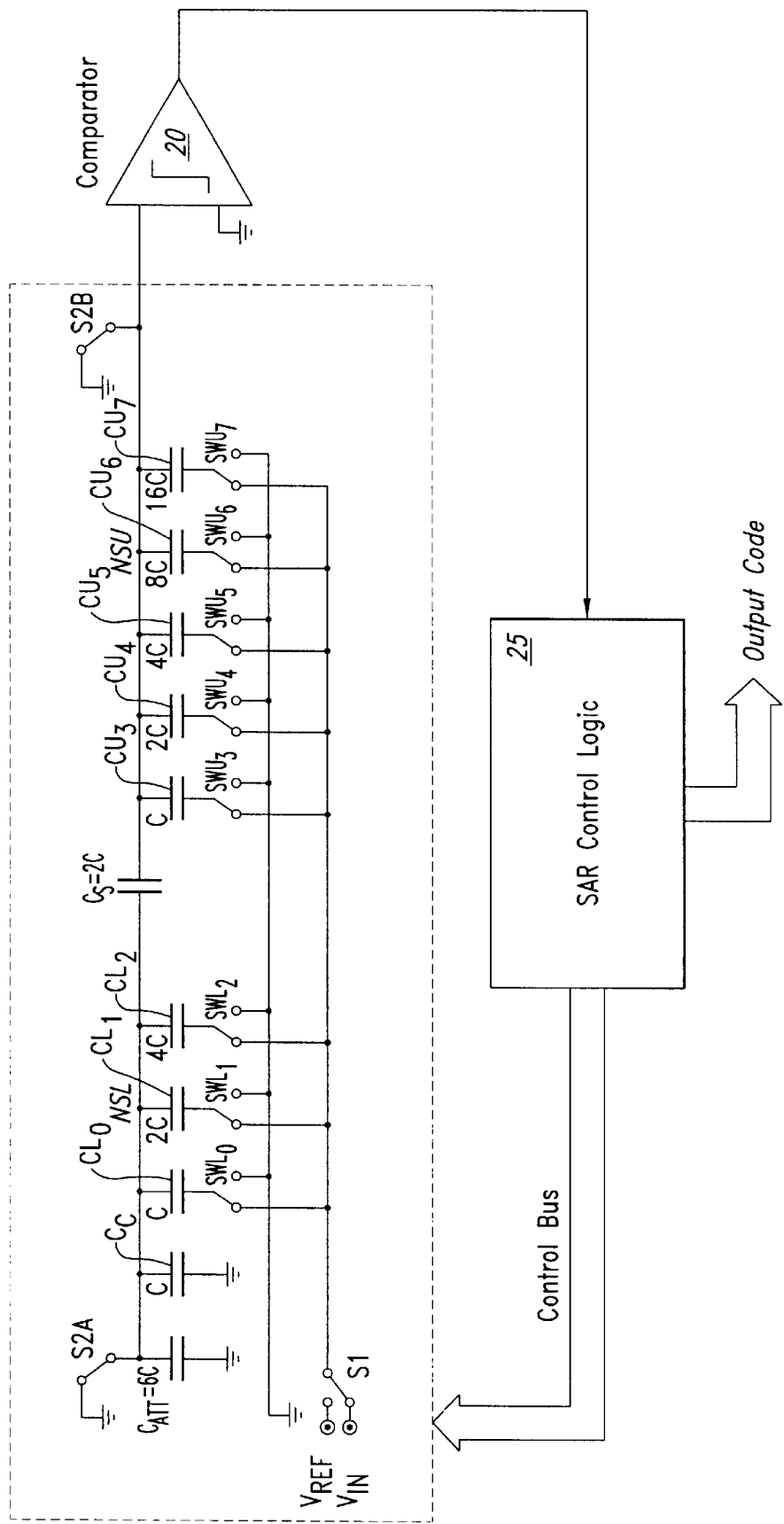
FIG. 7 illustrates schematically an A/D converter according to the invention.

FIG. 7 is a schematic diagram of an 8 bit SAR type A/D converter. The A/D converter uses the same switched capacitor array of the DAC shown in FIG. 4. However, the capacitor switches are connected by a switch S1 alternatively to a voltage reference Vref and an input voltage Vin that is to be converted to a digital output code. In addition, the A/D converter includes two switches S2A and S2B that respectively connect the array nodes NSL and NSU to ground. The array node NSU is connected to a first input of a comparator 20 having a second input connected to ground. An output of the comparator 20 is connected to an SAR control logic circuit 25. The SAR control logic circuit 25 has a first output terminal at which the digital output code is produced and a second output terminal that provides control signals to the switches S1, S2A, S2B, $SWL_{0-2}$, $SWU_{3-7}$ via a control bus.

The operation principle is that typical of an SAR. First, the input voltage Vin is charged into the switched capacitors: all of the switched capacitors $CL_{0-2}$, $CU_{3-7}$ are connected to Vin through switch S1; switches S2A, S2B are on and force to ground the nodes NSL and NSU. To define the digital code corresponding to Vin, switches S2A, S2B are opened and switch S1 is switched to reference voltage Vref. The switches $SWL_{0-2}$, $SWU_{3-7}$ associated with the capacitors $CL_{0-2}$, $CU_{3-7}$ are switched to ground or to Vref according to the typical logic of the successive approximation algorithm. The comparator 20 reads the sign of the voltage present (in a steady-state operation) at node NSU (D/A output) and outputs a corresponding digital signal. The control logic 25 is responsive to this digital signal to determine the value of the current bit of the output code and provides the switched capacitor array with a digital code for controlling the capacitor switches $SWL_{0-2}$, $SWU_{3-7}$ in the subsequent phase. After the last phase (8 in the example), on the SAR control logic output there is the digital code corresponding to Vin.

The figure shows a single-ended example, but the invention can be implemented in an analogous differential type arrangement as well. Similarly, the voltage references (ground and Vref in FIG. 7) can be two suitable voltages (as Vrefp and Vrefm in other figures). In addition, the capacitance $C_{ATT}$ could be implemented using the arrangement of capacitors shown in FIG. 5 except that the switches SWC1 and $SWC_2$ would alternately connect the capacitors $C_{A1}$ and $C_{A2}$ to ground and the switch S1.

It should be understood that many different embodiments of the invention may be provided without departing from the spirit and scope of the invention. The invention, therefore, is not limited to the embodiments described above but is limited only by the appended claims.

What is claimed is:

1. A switched capacitor digital to analog converter for providing an analog output signal corresponding to a digital input code, comprising:

a first converter segment having a first array of binary weighted capacitors with respective capacitances that are integer multiples of a predetermined unit capacitance, each of said capacitors having a first electrode connected to a first common node and a second electrode connected through respective controllable switching means to either one of a first and second reference voltage terminals;

a second converter segment having a second array of binary weighted capacitors with respective capacitances that are integer multiples of said predetermined unit capacitance, each of the capacitors of the second converter segment having a first electrode connected to a second common node and a second electrode connected through respective controllable switching means to either one of said first and second reference voltage terminals;

a coupling capacitor with a first electrode connected to the first common node and a second electrode connected to the second common node;

control means coupled to the controllable switching means of the first and second converter segments to open or close selectively connections to the first and second reference voltage terminals depending on binary values of bits of the digital input code;

an output terminal connected to the second common node for providing the analog output signal as a function of the digital input code; and capacitance means permanently connected between the first common node and a reference voltage terminal;

the coupling capacitor and the capacitance means have capacitances, $C_s$ and $C_{ATT}$ respectively, that substantially satisfy a relationship: $(2^P-1) \cdot C_s - C_{ATT} = 2^P \cdot C$, where p is a number of bits coded in the first converter segment and C is the unit capacitance.

2. The converter of claim 1 wherein the reference voltage terminal to which the capacitance means are connected is a third reference voltage terminal, the capacitance means including first, second, and third capacitors coupled respectively between the first common node and the first, second, and third reference voltage terminals.

3. The converter of claim 2 wherein the capacitance means further includes a first switch coupled between the first capacitor and the first reference voltage terminal and a second switch coupled between the second capacitor and the second reference voltage terminal, the converter further comprising a bit register having first and second control outputs respectively coupled to respective control terminals of the first and second switches.

4. The converter of claim 1, wherein the capacitor with a smallest capacitance in the first converter segment has substantially a same capacitance as a capacitor with a smallest capacitance in the second converter segment.

5. The converter of claim 1, wherein the capacitance means comprises at least one capacitor having a first electrode connected to the first common node and a second electrode connected, through associated controllable switching means, to either one of said first and second reference voltage terminals, and the control means are coupled to the controllable switching means associated with said at least one capacitor to open or close the connection to the first and second reference voltage terminals depending on binary values of at least one bit of a correction digital code.

6. The converter of claim 1 wherein the first and second converter segments, coupling capacitor, control means, output terminal, and capacitance means are part of a first circuit arrangement, the converter further comprising:

a second circuit arrangement that includes first and second converter segments, a coupling capacitor, control means, an output terminal, and capacitance means; and a differential signal detector having first and second inputs respectively coupled to outputs of the first and second circuit arrangements, and having an output at which a differential signal is produced based on signals received from the outputs of the first and second circuit.

7. A switched capacitor digital to analog converter for providing an analog output signal corresponding to a digital input code, comprising:

a first converter segment having a first array of switches and a first array of binary weighted capacitors with respective capacitances that are integer multiples of a predetermined unit capacitance, each of the capacitors being connected in series with a corresponding one of the switches to a first common node and;

a second converter segment having a second array of switches and a second array of binary weighted capacitors with respective capacitances that are integer multiples of the unit capacitance, each of the capacitors of the second converter being connected in series with a corresponding one of the switches of the second converter to a second common node;

a coupling capacitor connected between the first and second common nodes;

control lines coupled to the switches of the first and second converter segments to open or close selectively the switches depending on binary values of bits of the digital input code; and a capacitive element permanently connected between the first common node and a first reference voltage terminal, the coupling capacitor and the capacitive element having respective capacitances that are integer multiples of the unit capacitance.

8. The converter of claim 7 wherein the switches of the first array of switches are coupled respectively between a second reference voltage terminal and the corresponding capacitors of the first array of binary weighted capacitors and the switches of the second array of switches are coupled respectively between a third reference voltage terminal and the corresponding capacitors of the second array of binary weighted capacitors.

9. The converter of claim 8 wherein the capacitive element includes first, second, and third capacitors coupled respectively between the first common node and the first, second, and third reference voltage terminals.

10. The converter of claim 9 wherein the capacitive element further includes a first switch coupled between the second capacitor and the second reference voltage terminal and a second switch coupled between the third capacitor and the third reference voltage terminal, the converter further comprising a bit register having first and second control outputs respectively coupled to respective control terminals of the first and second switches.

11. The converter of claim 7 wherein the capacitor with a smallest capacitance in the first converter segment has substantially a same capacitance as a capacitor with a smallest capacitance in the second converter segment.

12. A switched capacitor digital to analog converter for providing an analog output signal corresponding to a digital input code, comprising:

a first converter segment having a first array of binary weighted capacitors with respective capacitances that are integer multiples of a predetermined unit capacitance, each of said capacitors having a first electrode connected to a first common node and a second electrode connected through respective controllable switching means to either one of a first and second reference voltage terminals;

a second converter segment having a second array of binary weighted capacitors with respective capacitances that are integer multiples of said predetermined unit capacitance, each of the capacitors of the second converter segment having a first electrode connected to a second common node and a second electrode connected through respective controllable switching means to either one of said first and second reference voltage terminals;

a coupling capacitor with a first electrode connected to the first common node and a second electrode connected to the second common node;

control means coupled to the controllable switching means of the first and second converter segments to open or close selectively connections to the first and second reference voltage terminals depending on binary values of bits of the digital input code;

an output terminal connected to the second common node for providing the analog output signal as a function of the digital input code; and capacitance means connected between the first common node and a reference voltage terminal;

the coupling capacitor and the capacitance means have capacitances, $C_s$ and $C_{ATT}$ respectively, that substantially satisfy a relationship: $(2^P-1) \cdot C_s - C_{ATT} = 2^P \cdot C$, where p is a number of bits coded in the first converter segment and C is the unit capacitance, wherein the reference voltage terminal to which the capacitance means are connected is a third reference voltage terminal, the capacitance means including first, second, and third capacitors coupled respectively between the first common node and the first, second, and third reference voltage terminals.

13. The converter of claim 12 wherein the capacitance means further includes a first switch coupled between the first capacitor and the first reference voltage terminal and a second switch coupled between the second capacitor and the second reference voltage terminal, the converter further comprising a bit register having first and second control outputs respectively coupled to respective control terminals of the first and second switches.

14. A switched capacitor digital to analog converter for providing an analog output signal corresponding to a digital input code, comprising:

a first converter segment having a first array of binary weighted capacitors with respective capacitances that are integer multiples of a predetermined unit capacitance, each of said capacitors having a first electrode connected to a first common node and a second electrode connected through respective controllable switching means to either one of a first and second reference voltage terminals;

a second converter segment having a second array of binary weighted capacitors with respective capacitances that are integer multiples of said predetermined unit capacitance, each of the capacitors of the second converter segment having a first electrode connected to a second common node and a second electrode connected through respective controllable switching means to either one of said first and second reference voltage terminals;

a coupling capacitor with a first electrode connected to the first common node and a second electrode connected to the second common node;

control means coupled to the controllable switching means of the first and second converter segments to open or close selectively connections to the first and second reference voltage terminals depending on binary values of bits of the digital input code;

an output terminal connected to the second common node for providing the analog output signal as a function of the digital input code; and capacitance means connected between the first common node and a reference voltage terminal;

the coupling capacitor and the capacitance means have capacitances, $C_s$ and $C_{ATT}$ respectively, that substantially satisfy a relationship: $(2^P-1) \cdot C_s - C_{ATT} = 2^P \cdot C$, where p is a number of bits coded in the first converter segment and C is the unit capacitance, wherein the first and second converter segments, coupling capacitor, control means, output terminal, and capacitance means are part of a first circuit arrangement, the converter further comprising:

a second circuit arrangement that includes first and second converter segments, a coupling capacitor, control means, an output terminal, and capacitance means; and a differential signal detector having first and second inputs respectively coupled to outputs of the first and second circuit arrangements, and having an output at which a differential signal is produced based on signals received from the outputs of the first and second circuit.

15. A switched capacitor digital to analog converter for providing an analog output signal corresponding to a digital input code, comprising:

a first converter segment having a first array of switches and a first array of binary weighted capacitors with respective capacitances that are integer multiples of a predetermined unit capacitance, each of the capacitors being connected in series with a corresponding one of the switches to a first common node and;

a second converter segment having a second array of switches and a second array of binary weighted capacitors with respective capacitances that are integer multiples of the unit capacitance, each of the capacitors of the second converter being connected in series with a corresponding one of the switches of the second converter to a second common node;

a coupling capacitor connected between the first and second common nodes;

control lines coupled to the switches of the first and second converter segments to open or close selectively the switches depending on binary values of bits of the digital input code; and a capacitive element connected between the first common node and a first reference voltage terminal, the coupling capacitor and the capacitive element having respective capacitances that are integer multiples of the unit capacitance, wherein the switches of the first array of switches are coupled respectively between a second reference voltage terminal and the corresponding capacitors of the first array of binary weighted capacitors and the switches of the second array of switches are coupled respectively between a third reference voltage terminal and the corresponding capacitors of the second array of binary weighted capacitors.

16. The converter of claim 15 wherein the capacitive element includes first, second, and third capacitors coupled respectively between the first common node and the first, second, and third reference voltage terminals.

17. The converter of claim 16 wherein the capacitive element further includes a first switch coupled between the second capacitor and the second reference voltage terminal and a second switch coupled between the third capacitor and the third reference voltage terminal, the converter further comprising a bit register having first and second control outputs respectively coupled to respective control terminals of the first and second switches.

* * * * *